United States Patent
Curtis

(10) Patent No.: US 12,507,377 B2
(45) Date of Patent: Dec. 23, 2025

(54) BREAKER VALVE FOR LIQUID FLOW SHUTOFF

(71) Applicant: Dell Products L.P., Round Rock, TX (US)

(72) Inventor: Robert B. Curtis, Georgetown, TX (US)

(73) Assignee: Dell Products L.P., Round Rock, TX (US)

(*) Notice: Subject to any disclaimer, the term of this patent is extended or adjusted under 35 U.S.C. 154(b) by 862 days.

(21) Appl. No.: 17/841,372

(22) Filed: Jun. 15, 2022

(65) Prior Publication Data

US 2023/0413475 A1  Dec. 21, 2023

(51) Int. Cl.
  *H05K 7/20* (2006.01)
  *F16K 17/36* (2006.01)
  *F16K 31/06* (2006.01)

(52) U.S. Cl.
  CPC ......... *H05K 7/20272* (2013.01); *F16K 17/36* (2013.01); *F16K 31/0682* (2013.01)

(58) Field of Classification Search
  CPC ........... H05K 7/20272; H05K 7/20763; F16K 17/36; F16K 17/363; F16K 31/0682; F16K 31/563
  See application file for complete search history.

(56) References Cited

U.S. PATENT DOCUMENTS

2014/0251583 A1* 9/2014 Eriksen ............ H05K 7/20772 165/104.33
2020/0378858 A1* 12/2020 Curtis .................... F17D 5/06

FOREIGN PATENT DOCUMENTS

DE      10104276 A1 * 9/2001 ......... H01R 13/5833
KR    101042476 B1 * 6/2011 ........... B25J 15/0625

* cited by examiner

*Primary Examiner* — Emmanuel E Duke
(74) *Attorney, Agent, or Firm* — Jackson Walker L.L.P.

(57) ABSTRACT

An information handling system may include an information handling resource, a liquid cooling system for providing cooling of the information handling resource, a leak detection system for detecting a leak of fluid from the liquid cooling system, and a breaker valve fluidically coupled to the liquid cooling system and communicatively coupled to the leak detection system and configured to, in response to a stimulus from the leak detection system indicating presence of a leak of fluid from the liquid cooling system, automatically transition from an open state in which the breaker valve permits flow of fluid through the breaker valve to a closed state in which the breaker valve impedes flow of fluid through the breaker valve.

18 Claims, 4 Drawing Sheets

BREAKER VALVE FOR LIQUID FLOW SHUTOFF

TECHNICAL FIELD

The present disclosure relates in general to information handling systems, and more particularly to liquid flow control in response to leak detection in liquid-cooled information handling systems.

BACKGROUND

As the value and use of information continues to increase, individuals and businesses seek additional ways to process and store information. One option available to users is information handling systems. An information handling system generally processes, compiles, stores, and/or communicates information or data for business, personal, or other purposes thereby allowing users to take advantage of the value of the information. Because technology and information handling needs and requirements vary between different users or applications, information handling systems may also vary regarding what information is handled, how the information is handled, how much information is processed, stored, or communicated, and how quickly and efficiently the information may be processed, stored, or communicated. The variations in information handling systems allow for information handling systems to be general or configured for a specific user or specific use such as financial transaction processing, airline reservations, enterprise data storage, or global communications. In addition, information handling systems may include a variety of hardware and software components that may be configured to process, store, and communicate information and may include one or more computer systems, data storage systems, and networking systems.

As processors, graphics cards, random access memory (RAM) and other components in information handling systems have increased in clock speed and power consumption, the amount of heat produced by such components as a side-effect of normal operation has also increased. Often, the temperatures of these components need to be kept within a reasonable range to prevent overheating, instability, malfunction, and damage leading to a shortened component lifespan. Accordingly, air movers (e.g., cooling fans and blowers) have often been used in information handling systems to cool information handling systems and their components.

To control temperature of components of an information handling system, an air mover may direct air over one or more heatsinks thermally coupled to individual components. Traditional approaches to cooling components may include a "passive" cooling system that serves to reject heat of a component to air driven by one or more system-level air movers (e.g., fans) for cooling multiple components of an information handling system in addition to the peripheral component. Another traditional approach may include an "active" cooling system that uses liquid cooling, in which a heat-exchanging cold plate is thermally coupled to the component, and a chilled fluid is passed through conduits internal to the cold plate to remove heat from the component.

However, one disadvantage to using liquid cooling is that components of the liquid cooling system (e.g., fluid fittings, fluid joints, hoses or other fluidic conduits, pumps, cold plates, etc.) may develop leaks over time due to vibration, thermal cycles, or aging. Liquid leaks within an information handling system may cause corrosion to components of the information handling system and/or damage to electrical or electronic circuitry of the information handling system.

Further, while existing information handling systems may employ various leak detection mechanisms, existing information handling systems typically have no automatic mechanism for terminating flow of liquid when a leak occurs. Instead, in order to remedy leaks in existing information handling systems, a user or administrator must manually disconnect components of a liquid cooling system in response to an alert indicating a leak.

SUMMARY

In accordance with the teachings of the present disclosure, the disadvantages and problems associated with remedying leaks of fluid from liquid cooling systems may be substantially reduced or eliminated.

In accordance with embodiments of the present disclosure, an information handling system may include an information handling resource, a liquid cooling system for providing cooling of the information handling resource, a leak detection system for detecting a leak of fluid from the liquid cooling system, and a breaker valve fluidically coupled to the liquid cooling system and communicatively coupled to the leak detection system and configured to, in response to a stimulus from the leak detection system indicating presence of a leak of fluid from the liquid cooling system, automatically transition from an open state in which the breaker valve permits flow of fluid through the breaker valve to a closed state in which the breaker valve impedes flow of fluid through the breaker valve.

In accordance with these and other embodiments of the present disclosure, a breaker valve may be configured to be fluidically coupled to a liquid cooling system and communicatively coupled to a leak detection system for detecting a leak of fluid from the liquid cooling system and further configured to, in response to a stimulus from the leak detection system indicating presence of a leak of fluid from the liquid cooling system, automatically transition from an open state in which the breaker valve permits flow of fluid through the breaker valve to a closed state in which the breaker valve impedes flow of fluid through the breaker valve.

In accordance with these and other embodiments of the present disclosure, a method may be provided for a breaker valve configured to be fluidically coupled to a liquid cooling system and communicatively coupled to a leak detection system for detecting a leak of fluid from the liquid cooling system. The method may include in response to a stimulus from the leak detection system indicating presence of a leak of fluid from the liquid cooling system, automatically transitioning from an open state in which the breaker valve permits flow of fluid through the breaker valve to a closed state in which the breaker valve impedes flow of fluid through the breaker valve.

Technical advantages of the present disclosure may be readily apparent to one skilled in the art from the figures, description and claims included herein. The objects and advantages of the embodiments will be realized and achieved at least by the elements, features, and combinations particularly pointed out in the claims.

It is to be understood that both the foregoing general description and the following detailed description are examples and explanatory and are not restrictive of the claims set forth in this disclosure.

BRIEF DESCRIPTION OF THE DRAWINGS

A more complete understanding of the present embodiments and advantages thereof may be acquired by referring to the following description taken in conjunction with the accompanying drawings, in which like reference numbers indicate like features, and wherein.

DETAILED DESCRIPTION

Figure 1:
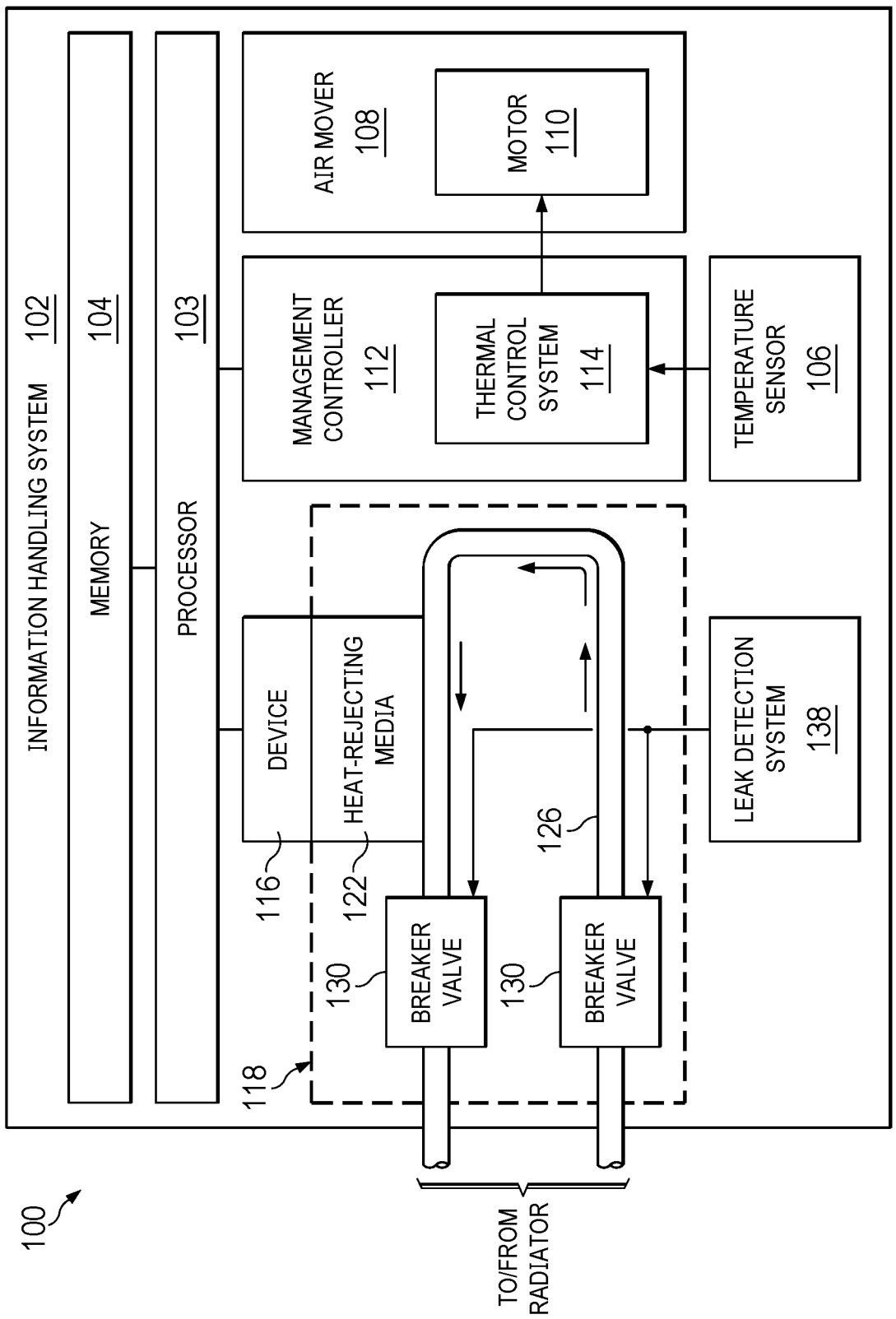
FIG. 1 illustrates a block diagram of an example information handling system, in accordance with embodiments of the present disclosure.
Figure 2A:
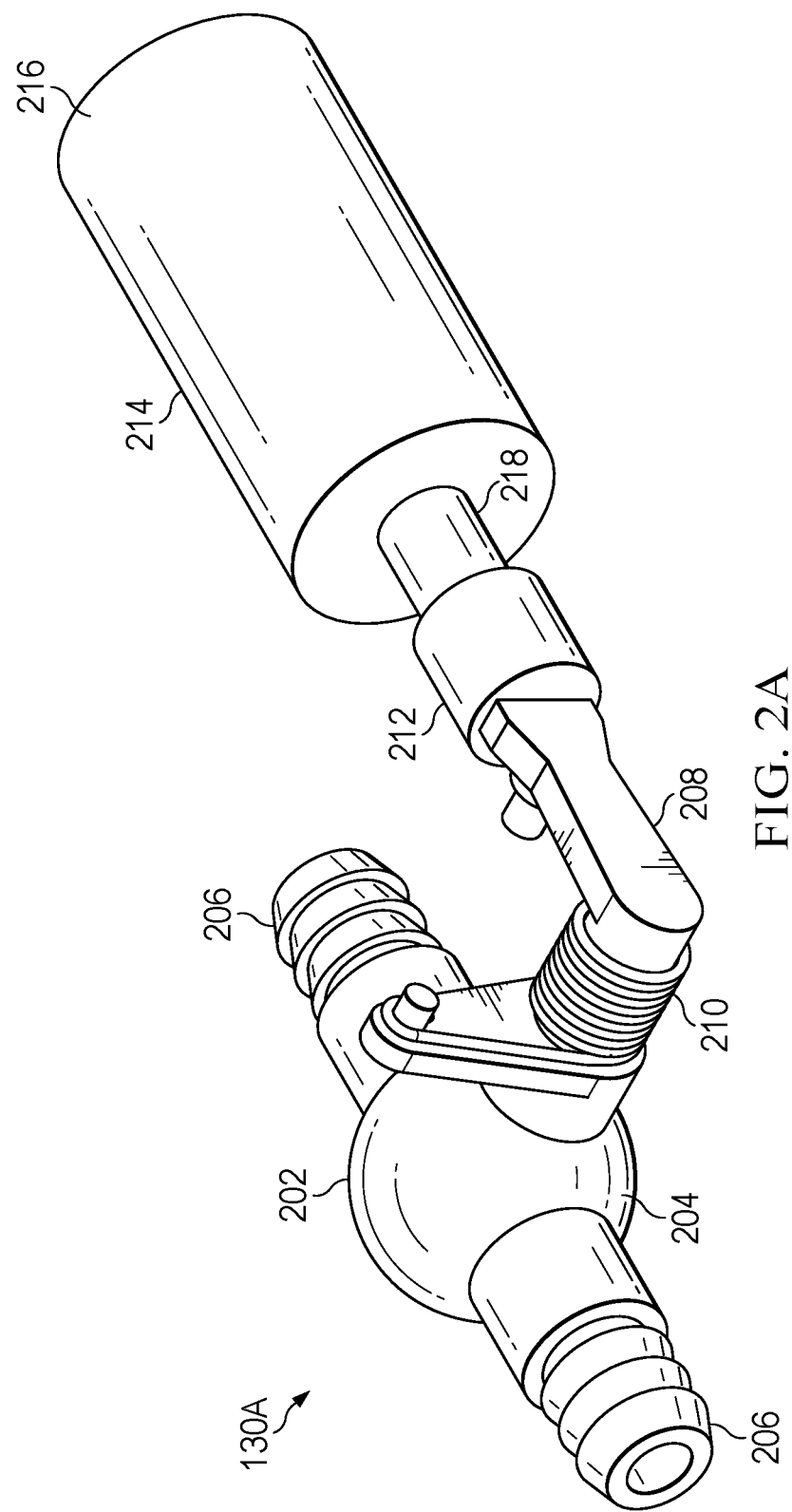
FIG. 2A illustrates a perspective view of selected components of a breaker valve in an open position, in accordance with embodiments of the present disclosure.
Figure 2B:
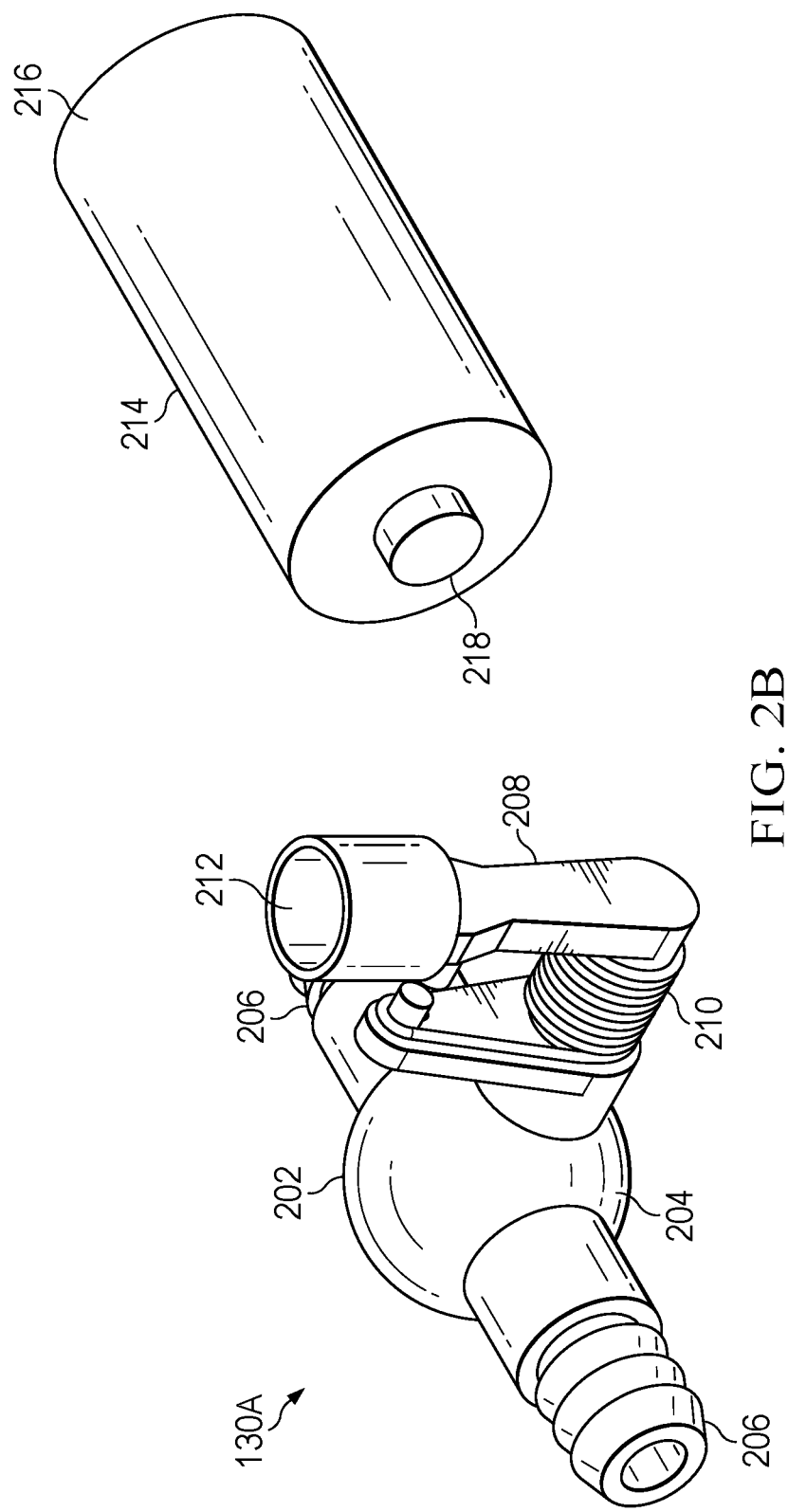
FIG. 2B illustrates a perspective view of selected components of a breaker valve in a closed position, in accordance with embodiments of the present disclosure.
Figure 3:
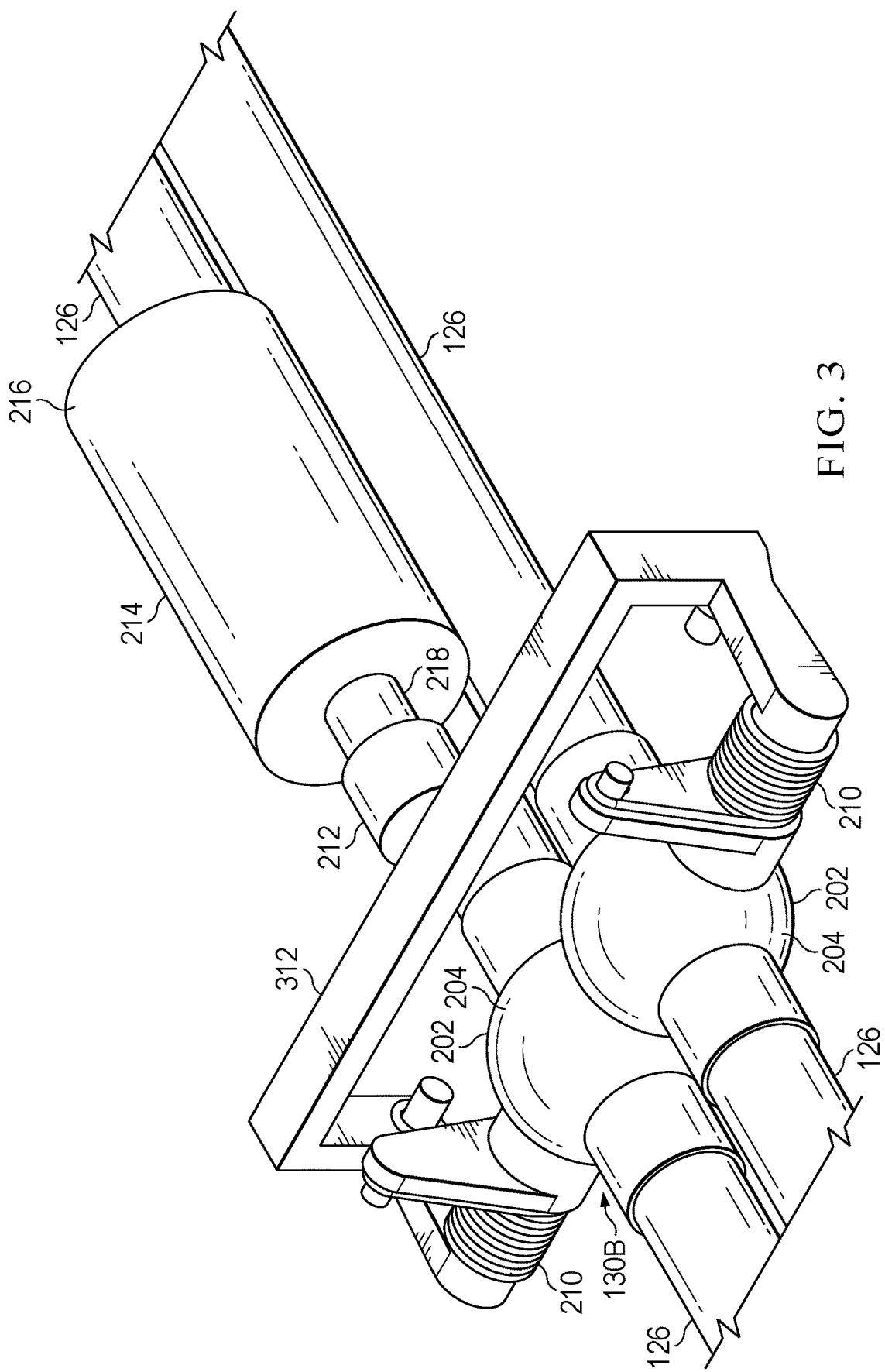
FIG. 3 illustrates a perspective view of selected components of a tandem breaker valve in an open position, in accordance with embodiments of the present disclosure.

Preferred embodiments and their advantages are best understood by reference to FIGS. 1 through 3, wherein like numbers are used to indicate like and corresponding parts.

For the purposes of this disclosure, an information handling system may include any instrumentality or aggregate of instrumentalities operable to compute, classify, process, transmit, receive, retrieve, originate, switch, store, display, manifest, detect, record, reproduce, handle, or utilize any form of information, intelligence, or data for business, scientific, control, entertainment, or other purposes. For example, an information handling system may be a personal computer, a PDA, a consumer electronic device, a network storage device, or any other suitable device and may vary in size, shape, performance, functionality, and price. The information handling system may include memory, one or more processing resources such as a central processing unit (CPU) or hardware or software control logic. Additional components of the information handling system may include one or more storage devices, one or more communications ports for communicating with external devices as well as various input and output (I/O) devices, such as a keyboard, a mouse, and a video display. The information handling system may also include one or more buses operable to transmit communication between the various hardware components.

For the purposes of this disclosure, computer-readable media may include any instrumentality or aggregation of instrumentalities that may retain data and/or instructions for a period of time. Computer-readable media may include, without limitation, storage media such as a direct access storage device (e.g., a hard disk drive or floppy disk), a sequential access storage device (e.g., a tape disk drive), compact disk, CD-ROM, DVD, random access memory (RAM), read-only memory (ROM), electrically erasable programmable read-only memory (EEPROM), and/or flash memory; as well as communications media such as wires, optical fibers, microwaves, radio waves, and other electromagnetic and/or optical carriers; and/or any combination of the foregoing.

For the purposes of this disclosure, information handling resources may broadly refer to any component system, device or apparatus of an information handling system, including without limitation processors, buses, memories, I/O devices and/or interfaces, storage resources, network interfaces, motherboards, integrated circuit packages; electro-mechanical devices (e.g., air movers), displays, and power supplies.

FIG. 1 illustrates a block diagram of an example information handling system 102, in accordance with embodiments of the present disclosure. In some embodiments, information handling system 102 may comprise a server chassis configured to house a plurality of servers or "blades." In other embodiments, information handling system 102 may comprise a personal computer (e.g., a desktop computer, laptop computer, mobile computer, and/or notebook computer). In yet other embodiments, information handling system 102 may comprise a storage enclosure configured to house a plurality of physical disk drives and/or other computer-readable media for storing data. As shown in FIG. 1, information handling system 102 may include a chassis 100 housing a processor 103, a memory 104, a temperature sensor 106, an air mover 108, a management controller 112, a device 116, a liquid cooling system 118, and a leak detection system 138.

Processor 103 may comprise any system, device, or apparatus operable to interpret and/or execute program instructions and/or process data, and may include, without limitation a microprocessor, microcontroller, digital signal processor (DSP), application specific integrated circuit (ASIC), or any other digital or analog circuitry configured to interpret and/or execute program instructions and/or process data. In some embodiments, processor 103 may interpret and/or execute program instructions and/or process data stored in memory 104 and/or another component of information handling system 102.

Memory 104 may be communicatively coupled to processor 103 and may comprise any system, device, or apparatus operable to retain program instructions or data for a period of time. Memory 104 may comprise random access memory (RAM), electrically erasable programmable read-only memory (EEPROM), a PCMCIA card, flash memory, magnetic storage, opto-magnetic storage, or any suitable selection and/or array of volatile or non-volatile memory that retains data after power to information handling system 102 is turned off.

Air mover 108 may include any mechanical or electro-mechanical system, apparatus, or device operable to move air and/or other gases in order to cool information handling resources of information handling system 102. In some embodiments, air mover 108 may comprise a fan (e.g., a rotating arrangement of vanes or blades which act on the air). In other embodiments, air mover 108 may comprise a blower (e.g., a centrifugal fan that employs rotating impellers to accelerate air received at its intake and change the direction of the airflow). In these and other embodiments, rotating and other moving components of air mover 108 may be driven by a motor 110. The rotational speed of motor 110 may be controlled by an air mover control signal communicated from thermal control system 114 of management controller 112. In operation, air mover 108 may cool information handling resources of information handling system 102 by drawing cool air into an enclosure housing the information handling resources from outside the chassis, expel warm air from inside the enclosure to the outside of such enclosure, and/or move air across one or more heat sinks (not explicitly shown) internal to the enclosure to cool one or more information handling resources.

Management controller 112 may comprise any system, device, or apparatus configured to facilitate management and/or control of information handling system 102 and/or one or more of its component information handling resources. Management controller 112 may be configured to issue commands and/or other signals to manage and/or control information handling system 102 and/or its information handling resources. Management controller 112 may comprise a microprocessor, microcontroller, DSP, ASIC, field programmable gate array ("FPGA"), EEPROM, or any combination thereof. Management controller 112 also may be configured to provide out-of-band management facilities for management of information handling system 102. Such management may be made by management controller 112 even if information handling system 102 is powered off or powered to a standby state. In certain embodiments, management controller 112 may include or may be an integral part of a baseboard management controller (BMC), a remote access controller (e.g., a Dell Remote Access Controller or Integrated Dell Remote Access Controller), or an enclosure controller. In other embodiments, management controller 112 may include or may be an integral part of a chassis management controller (CMC).

As shown in FIG. 1, management controller 112 may include a thermal control system 114. Thermal control system 114 may include any system, device, or apparatus configured to receive one or more signals indicative of one or more temperatures within information handling system 102 (e.g., one or more signals from one or more temperature sensors 106), and based on such signals, calculate an air mover driving signal to maintain an appropriate level of cooling, increase cooling, or decrease cooling, as appropriate, and communicate such air mover driving signal to air mover 108. In these and other embodiments, thermal control system 114 may be configured to receive information from other information handling resources and calculate the air mover driving signal based on such received information in addition to temperature information. For example, as described in greater detail below, thermal control system 114 may receive configuration data from device 116 and/or other information handling resources of information handling system 102, which may include thermal requirement information of one or more information handling resources. In addition to temperature information collected from sensors within information handling system 102, thermal control system 114 may also calculate the air mover driving signal based on such information received from information handling resources.

Temperature sensor 106 may be any system, device, or apparatus (e.g., a thermometer, thermistor, etc.) configured to communicate a signal to processor 103 or another controller indicative of a temperature within information handling system 102. In many embodiments, information handling system 102 may comprise a plurality of temperature sensors 106, wherein each temperature sensor 106 detects a temperature of a particular component and/or location within information handling system 102.

Device 116 may comprise any component information handling system of information handling system 102, including without limitation processors, buses, memories, I/O devices and/or interfaces, storage resources, network interfaces, motherboards, integrated circuit packages, electro-mechanical devices, displays, and power supplies.

Oftentimes, an architecture of information handling system 102 may be such that device 116 may not be adequately cooled by air mover 108, and thus liquid cooling system 118 may provide cooling of device 116 in addition to or in lieu of air mover 108. As shown in FIG. 1, liquid cooling system 118 may include heat-rejecting media 122, one or more breaker valves 130, and fluidic conduits 126.

In normal operation, a pump (which is not explicitly shown and may be external to information handling system 102) may induce a flow of liquid (e.g., water, ethylene glycol, propylene glycol, or other coolant) through various fluidic conduits 126 of information handling system 102 and breaker valves 130. As fluid passes by heat-rejecting media 122 in a fluidic conduit 126 proximate to device 116, heat may be transferred from device 116 to heat-rejecting media 122 and from heat-rejecting media 122 to the liquid coolant in fluidic conduit 126. Such heated coolant may flow to a radiator (which is not explicitly shown and may be external to information handling system 102), heat from the coolant may be transferred from the coolant to air ambient to such radiator, thus cooling the fluid.

Heat-rejecting media 122 may include any system, device, or apparatus configured to transfer heat from an information handling resource (e.g., device 116, as shown in FIG. 1), thus reducing a temperature of the information handling resource. For example, heat-rejecting media 122 may include a solid thermally coupled to the information handling resource (e.g., heatpipe, heat spreader, heatsink, finstack, etc.) such that heat generated by the information handling resource is transferred from the information handling resource.

A breaker valve 130 may include any device, system or apparatus that regulates, directs, and/or controls the flow of a fluid (e.g., a coolant liquid in fluidic conduits 126) by opening, closing, or partially obstructing one or more passageways. When breaker valve 130 is open, coolant liquid may flow in a direction from higher pressure to lower pressure. However, when a breaker valve 130 is closed, flow of coolant liquid may be impeded. In addition, a breaker valve 130 may be configured with a bias to remain in an open state in the absence of a stimulus, but may also be configured to, responsive to such stimulus, for example an indication from leak detection system 138 that a leak has been detected within liquid cooling system 118, automatically transition from open to closed, as described in greater detail below.

Leak detection system 138 may be communicatively coupled to management controller 112 and may comprise any system, device, or apparatus configured to detect a presence of a leak of the cooling fluid of liquid cooling system 118, and generate one or more electrical signals indicative of whether such a leak is present. While the structure of leak detection system 138 is beyond the scope of this disclosure, leak detection system 138 may be implemented in any suitable manner, including without limitation as described in either or both of U.S. Pat. Nos. 11,016,001 and 11,346,741, both of which are incorporated by reference herein in their entireties.

In addition to processor 103, memory 104, temperature sensor 106, air mover 108, management controller 112, device 116, liquid cooling system 118, and leak detection system 138, information handling system 102 may include one or more other information handling resources. In addition, for the sake of clarity and exposition of the present disclosure, FIG. 1 depicts only one air mover 108 and one device 116. In embodiments of the present disclosure, information handling system 102 may include any number of air movers 108 and devices 116. Furthermore, for the sake of clarity and exposition of the present disclosure, FIG. 1 depicts device 116 including a liquid cooling system 118 for cooling of device 116. However, in some embodiments, approaches similar or identical to those used to actively cool device 116 as described herein may be employed to provide active cooling of processor 103, memory 104, management controller 112, and/or any other information handling resource of information handling system 102.

Further, although FIG. 1 depicts breaker valves 130 as being internal to chassis 100 of information handling system 102, in some embodiments, one or more of breaker valves 130 may reside external to chassis 100.

FIG. 2A illustrates a perspective view of selected components of a breaker valve 130A in an open position, in accordance with embodiments of the present disclosure. Further, FIG. 2B illustrates a perspective view of selected components of breaker valve 130A in a closed position, in accordance with embodiments of the present disclosure. In some embodiments, breaker valve 130A as shown in FIGS. 2A and 2B may be used to implement any or all of breaker valves 130 depicted in FIG. 1.

As shown in FIGS. 2A and 2B, breaker valve 130A may comprise a two-port valve 202 having a valve body 204 and each port implemented with a respective fluid fitting 206 configured to couple to a fluidic conduit 126. Breaker valve 130A may also include a throw 208 mechanically coupled to valve body 204 and configured to translate between an open position, as shown in FIG. 2A and a closed position, as shown in FIG. 2B. In the open position, portions of throw 208 internal to valve body 204 may allow flow of liquid between ports of breaker valve 130A. In the closed position, portions of throw 208 internal to valve body 204 may impede flow of liquid between ports of breaker valve 130A.

As also shown in FIGS. 2A and 2B, breaker valve 130A may comprise a spring 210 mechanically coupled between valve body 204 and throw 208. Valve body 204, throw 208, and spring 210 may be arranged such that, in the absence of a force counteracting the spring force of spring 210, the spring force 210 may bias throw 208 in the closed position.

As further shown in FIGS. 2A and 2B, breaker valve 130A may include a solenoid 214 comprising a body 216 configured to house an electromagnetic coil (not explicitly shown) and a movable core 218 of ferromagnetic material arranged at least partially within the electromagnetic coil. In the absence of stimulus to solenoid 214, a negligible current may flow through the ferromagnetic material, and movable core 218 may remain in a first position relative to body 214 in the absence of such stimulus. Accordingly, in such first position, an end of movable core 218 may mechanically engage with a receptacle 212 or other mechanical feature of throw 208 to overcome the spring force of spring 210 to maintain throw 208 in the open position, as shown in FIG. 2A.

However, in response to a stimulus to solenoid 214, for example a signal generated by leak detection system 138 indicating presence of a leak, leak detection system 138, solenoid 214, and/or another electrical component of information handling system 102 may cause a current to flow in the electromagnetic coil of solenoid 214, which in turn may cause movable core 218 to move to a second position relative to body 216. Such movement may cause movable core 218 to mechanically disengage from throw 208, and the spring force of spring 210 may cause throw 208 to move into the closed position, as shown in FIG. 2B.

In some embodiments, once in the closed position, throw 208 may remain in the closed position until manually "reset" into the open position, akin to how an electrical breaker switch must be manually reset when a circuit is broken by a circuit breaker.

FIG. 3 illustrates a perspective view of selected components of a tandem breaker valve 130B in an open position, in accordance with embodiments of the present disclosure.

In some embodiments, both breaker valves 130 depicted in FIG. 1 may be implemented by tandem breaker valve 130B.

As shown in FIG. 3, tandem breaker valve 130B may be similar in many respects to breaker valve 130A as described above, except that tandem breaker valve 130B may include two two-port valves 202 and a throw 312 and solenoid 214 common to both of two-port valves 202, such that two-port valves 202 are both open at the same time or closed at the same time.

As used herein, when two or more elements are referred to as "coupled" to one another, such term indicates that such two or more elements are in electronic communication or mechanical communication, as applicable, whether connected indirectly or directly, with or without intervening elements.

This disclosure encompasses all changes, substitutions, variations, alterations, and modifications to the example embodiments herein that a person having ordinary skill in the art would comprehend. Similarly, where appropriate, the appended claims encompass all changes, substitutions, variations, alterations, and modifications to the example embodiments herein that a person having ordinary skill in the art would comprehend. Moreover, reference in the appended claims to an apparatus or system or a component of an apparatus or system being adapted to, arranged to, capable of, configured to, enabled to, operable to, or operative to perform a particular function encompasses that apparatus, system, or component, whether or not it or that particular function is activated, turned on, or unlocked, as long as that apparatus, system, or component is so adapted, arranged, capable, configured, enabled, operable, or operative. Accordingly, modifications, additions, or omissions may be made to the systems, apparatuses, and methods described herein without departing from the scope of the disclosure. For example, the components of the systems and apparatuses may be integrated or separated. Moreover, the operations of the systems and apparatuses disclosed herein may be performed by more, fewer, or other components and the methods described may include more, fewer, or other steps. Additionally, steps may be performed in any suitable order. As used in this document, "each" refers to each member of a set or each member of a subset of a set.

Although exemplary embodiments are illustrated in the figures and described above, the principles of the present disclosure may be implemented using any number of techniques, whether currently known or not. The present disclosure should in no way be limited to the exemplary implementations and techniques illustrated in the FIGS. and described above.

Unless otherwise specifically noted, articles depicted in the figures are not necessarily drawn to scale.

All examples and conditional language recited herein are intended for pedagogical objects to aid the reader in understanding the disclosure and the concepts contributed by the inventor to furthering the art, and are construed as being without limitation to such specifically recited examples and conditions. Although embodiments of the present disclosure have been described in detail, it should be understood that various changes, substitutions, and alterations could be made hereto without departing from the spirit and scope of the disclosure.

Although specific advantages have been enumerated above, various embodiments may include some, none, or all of the enumerated advantages. Additionally, other technical advantages may become readily apparent to one of ordinary skill in the art after review of the foregoing figures and description.

To aid the Patent Office and any readers of any patent issued on this application in interpreting the claims appended hereto, applicants wish to note that they do not intend any of the appended claims or claim elements to invoke 35 U.S.C. § 112(f) unless the words "means for" or "step for" are explicitly used in the particular claim.

What is claimed is:

1. An information handling system comprising: an information handling resource; a liquid cooling system for providing cooling of the information handling resource; a leak detection system for detecting a leak of fluid from the liquid cooling system; and a breaker valve fluidically coupled to the liquid cooling system and communicatively coupled to the leak detection system and configured to, in response to a stimulus from the leak detection system indicating presence of a leak of fluid from the liquid cooling system, automatically transition from an open state in which the breaker valve permits flow of fluid through the breaker valve to a closed state in which the breaker valve impedes flow of fluid through the breaker valve, wherein the breaker valve comprises: a valve having a body and two ports mechanically and fluidically coupled to the body; and a throw mechanically coupled to the body and configured to be translated between an open position in which the throw causes the valve to be in the open state and a closed position in which the throw causes the valve to be in the closed state; wherein the throw is mechanically biased in the closed position.

2. The information handling system of claim 1, the breaker valve further comprising a spring mechanically coupled to the body and the throw and arranged such that the throw is mechanically biased in the closed position.

3. The information handling system of claim 2, the breaker valve further comprising a solenoid having a movable core configured to mechanically engage with a mechanical feature of the throw in order to overcome the spring force of the spring and maintain the throw in the open position in an absence of the stimulus.

4. The information handling system of claim 3, wherein the solenoid is configured to mechanically disengage the movable core from the mechanical feature in the presence of the stimulus in order to allow the spring force to cause the throw to translate to the closed position.

5. The information handling system of claim 3, wherein the mechanical feature comprises a receptacle formed in the throw.

6. The information handling system of claim 1, the breaker valve further comprising a second valve having a second body and two second ports mechanically and fluidically coupled to the second body, the second body mechanically coupled to the throw such that the throw causes the second valve to be in the open state when the throw is in the open position and in the closed state when the throw is in the closed position.

7. A breaker valve comprising:
a valve having a body and two ports mechanically and fluidically coupled to the body; and
a throw mechanically coupled to the body and configured to be translated between an open position in which the throw causes the valve to be in the open state and a closed position in which the throw causes the valve to be in the closed state; wherein the throw is mechanically biased in the closed position.

8. The breaker valve of claim 7, further comprising a spring mechanically coupled to the body and the throw and arranged such that the throw is mechanically biased in the closed position.

9. The breaker valve of claim 8, further comprising a solenoid having a movable core configured to mechanically engage with a mechanical feature of the throw in order to overcome the spring force of the spring and maintain the throw in the open position in an absence of the stimulus.

10. The breaker valve of claim 9, wherein the solenoid is configured to mechanically disengage the movable core from the mechanical feature in the presence of the stimulus in order to allow the spring force to cause the throw to translate to the closed position.

11. The breaker valve of claim 9, wherein the mechanical feature comprises a receptacle formed in the throw.

12. The breaker valve of claim 7, further comprising a second valve having a second body and two second ports mechanically and fluidically coupled to the second body, the second body mechanically coupled to the throw such that the throw causes the second valve to be in the open state when the throw is in the open position and in the closed state when the throw is in the closed position.

13. A method comprising mechanically biasing a throw in a closed position, wherein the throw is mechanically coupled to a body having of a valve comprising the body and two ports mechanically and fluidically coupled to the body and wherein the throw is mechanically coupled to the body and configured to be translated between an open position in which the throw causes the valve to be in the open state and a closed position in which the throw causes the valve to be in the closed state.

14. The method of claim 13, further arranging a spring mechanically coupled to the body and the throw such that the throw is mechanically biased in the closed position.

15. The method of claim 14, further comprising maintaining the throw in the open position in an absence of the stimulus with a solenoid having a movable core configured to mechanically engage with a mechanical feature of the throw in order to overcome the spring force of the spring and maintain the throw in the open position in the absence of the stimulus.

16. The method of claim 15, further comprising mechanically disengaging, with the solenoid, the movable core from the mechanical feature in the presence of the stimulus in order to allow the spring force to cause the throw to translate to the closed position.

17. The method of claim 15, wherein the mechanical feature comprises a receptacle formed in the throw.

18. The method of claim 13, the breaker valve further comprising a second valve having a second body and two second ports mechanically and fluidically coupled to the second body, the second body mechanically coupled to the throw such that the throw causes the second valve to be in the open state when the throw is in the open position and in the closed state when the throw is in the closed position.

* * * * *